United States Patent
Cai et al.

(10) Patent No.: US 12,131,924 B2
(45) Date of Patent: Oct. 29, 2024

(54) METHOD FOR PROCESSING SEMICONDUCTOR WAFERS

(71) Applicant: Yangtze Memory Technologies Co., Ltd., Hubei (CN)

(72) Inventors: Liquan Cai, Hubei (CN); Peng Chen, Hubei (CN); Houde Zhou, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 832 days.

(21) Appl. No.: 17/119,665

(22) Filed: Dec. 11, 2020

(65) Prior Publication Data

US 2022/0157627 A1 May 19, 2022

Related U.S. Application Data

(63) Continuation of application No. PCT/CN2020/129954, filed on Nov. 19, 2020.

(51) Int. Cl.
*H01L 21/67* (2006.01)
*B23K 26/38* (2014.01)

(52) U.S. Cl.
CPC ........ *H01L 21/67253* (2013.01); *B23K 26/38* (2013.01); *H01L 21/67092* (2013.01); *H01L 21/67288* (2013.01)

(58) Field of Classification Search
CPC ............... H01L 21/67092; H01L 21/67; H01L 21/67288; H01L 21/67253; H01L 21/66;

(Continued)

(56) References Cited

U.S. PATENT DOCUMENTS

| | | | |
|---|---|---|---|
| 8,809,166 B2 | 8/2014 | Buenning et al. | |
| 9,275,903 B2* | 3/2016 | Kwak | H01L 21/268 |

(Continued)

FOREIGN PATENT DOCUMENTS

| | | |
|---|---|---|
| CN | 101685786 A | 3/2010 |
| CN | 103165412 A | 6/2013 |

(Continued)

OTHER PUBLICATIONS

International Preliminary Report on Patentability and Written Opinion of the International Searching Authority directed to International Patent Application No. PCT/CN2020/129954, issued May 16, 2023.

(Continued)

*Primary Examiner* — Nikolay K Yushin
(74) *Attorney, Agent, or Firm* — Conley Rose, P.C.

(57) ABSTRACT

The present disclosure describes methods and systems for processing semiconductor wafers. A method for processing a wafer includes measuring one or more wafer characteristics of the wafer using a plurality of detectors. The wafer includes a device region and a perimeter region. The method also includes determining a wafer modification profile of the wafer based on the measured one or more wafer characteristics. The method further includes modifying a ring-shaped portion of the wafer within the perimeter region using the wafer modification profile. The modified ring-shaped portion has a penetration depth that is less than a thickness of the wafer. The method further includes performing a wafer thinning process on the wafer.

15 Claims, 9 Drawing Sheets

(58) Field of Classification Search
CPC .............. H01L 21/6836; H01L 21/683; H01L 21/6838; H01L 21/304; H01L 21/30625; H01L 21/306; H01L 22/12; H01L 22/10; H01L 22/20; H01L 2221/68327; H01L 2221/6834; H01L 2221/6835; H01L 22/14; B23K 26/38; B23K 26/03; B23K 26/032; B23K 26/53; B23K 2101/40; B23K 103/00; B23K 103/50; B23K 103/08; B23K 2103/56

See application file for complete search history.

(56) References Cited

U.S. PATENT DOCUMENTS

| | | | |
|---|---|---|---|
| 9,601,437 | B2 | 3/2017 | Albermann et al. |
| 10,825,678 | B2 * | 11/2020 | Sugiya .............. B23K 26/0006 |
| 11,450,523 | B2 * | 9/2022 | Tanoue ............. H01L 21/67288 |
| 2015/0140785 | A1 * | 5/2015 | Kwak ............... H01L 21/02013 438/464 |
| 2017/0076969 | A1 | 3/2017 | Shirono et al. |
| 2019/0181045 | A1 | 6/2019 | Lu et al. |
| 2020/0027773 | A1 | 1/2020 | Lin |
| 2020/0111658 | A1 | 4/2020 | Sugiya |
| 2021/0242010 | A1 * | 8/2021 | Tanoue ............. B23K 26/0006 |

FOREIGN PATENT DOCUMENTS

| | | |
|---|---|---|
| CN | 103794468 A | 5/2014 |
| CN | 103887156 A | 6/2014 |
| CN | 105405806 A | 3/2016 |
| CN | 109473368 A | 3/2019 |
| CN | 110993493 A | 4/2020 |
| JP | 2004-063883 A | 2/2004 |
| JP | 2007-096115 A | 4/2007 |
| TW | 389935 B | 5/2000 |
| TW | 200415736 A | 8/2004 |
| TW | 201940759 A | 10/2019 |
| WO | WO 2019/208359 A1 | 10/2019 |

OTHER PUBLICATIONS

International Search Report of the International Searching Authority directed to related International Patent Application No. PCT/CN2020/129954, mailed Aug. 18, 2021; 5 pages.

Japanese Notice of Reasons for Refusal directed to Japanese Patent Application No. 2022-578917, mailed Mar. 4, 2024; 13 pages.

* cited by examiner

METHOD FOR PROCESSING SEMICONDUCTOR WAFERS

CROSS-REFERENCE TO RELATED APPLICATIONS

This application claims priority to PCT Patent Application No. PCT/CN2020/129954, filed on Nov. 19, 2020, which is incorporated herein by reference in its entirety.

TECHNICAL FIELD

The present disclosure generally relates to the field of semiconductor technology, and more particularly, to systems and methods for improving the yield of semiconductor wafers processing.

BACKGROUND

Semiconductor wafers undergo numerous processing operations during semiconductor wafer fabrication processing in an integrated circuit (IC) fabrication facility. To increase device density, semiconductor wafers can be bonded together and a wafer thinning process is often performed on the bonded semiconductor wafers to reduce wafer thickness. Present wafer processing techniques have drawbacks such as wafer damage resulting from wafer thinning that need to be addresses.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

DETAILED DESCRIPTION

Figure 1A:
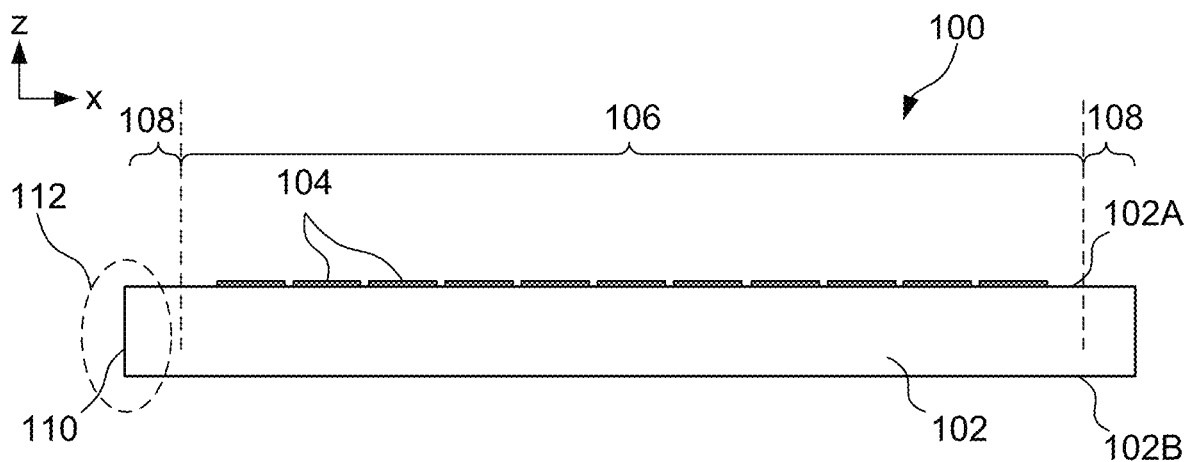
FIGS. 1A and 1B are views of a semiconductor wafer, in accordance with some embodiments of the present disclosure.

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate comprises a top surface and a bottom surface. The top surface of the substrate is where a semiconductor device is formed, and therefore the semiconductor device is formed at a top side of the substrate. The bottom surface is opposite to the top surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D NAND memory device" (referred to herein as "memory device") refers to a semiconductor device with vertically-oriented strings of 3D NAND memory cell transistors (referred to herein as "memory strings," such as NAND strings or 3D NAND strings) on a laterally-oriented substrate so that the memory strings extend in the vertical direction with respect to the substrate. As used herein, the term "vertical/vertically" means nominally perpendicular to the lateral surface of a substrate.

In the present disclosure, the term "horizontal/horizontally" means nominally parallel to the lateral surface of a substrate.

Stacking semiconductor wafers to form three-dimensional integrated circuits is one of the measures to meet the demand for increased device density. In general, stacked wafers can provide benefits such as smaller die size, higher device density, and improved performance compared to monolithic integrated circuits. Stacking semiconductor wafers can include attaching one semiconductor wafer to another using various methods, such as bonding or applying adhesives, and the stacked semiconductor wafers can be thinned down to reduce their overall thickness in order to further minimize device footprint and reduce device size. For example, device density of three-dimensional ("3D") memory devices can be increased by stacking a peripheral device and back-end-of-line (BEOL) interconnect above an array device, and performing a wafer thinning process on the stacked wafer structure to reduce its overall thickness. Wafer thinning process can be a back grinding process where a semiconductor wafer undergoes a grinding process using a grinding apparatus. Specifically, the semiconductor wafer can be positioned on a chuck via adhesive and/or vacuum and a grinding head is pressed against a surface of the semiconductor wafer and configured to perform rotational and lateral movements to uniformly remove material from the semiconductor wafer. Wafer thinning process can also include a polishing process such as a chemical mechanical polishing (CMP) process, which utilizes a chemical slurry in conjunction with a polishing pad to remove material from the wafer until a nominal wafer thickness is achieved. During a CMP process, a wafer is positioned on a chuck via adhesive and/or vacuum and rotated at a pre-set rotational speed while a polishing pad held by a polishing head is pressed against a lateral surface of the rotating wafer. As wafers are thinned down during a grinding or a CMP process, wafer defects can cause physical damages to the wafers that in turn may reduce device yield and increase manufacturing costs. For example, wafer perimeter regions can contain irregular shaped edges that can propagate into fractures or cracks through the wafer when a force is applied to the wafer by the polishing head. The fractures or cracks can impair the wafer's structural integrity and render it unusable for further processing.

To address the above shortcomings, embodiments described herein are directed to provide systems and methods for improving wafer processing yield during a wafer thinning process. More particularly, this disclosure is directed to a wafer processing system that is configured to determine wafer profiles and modify the wafer accordingly prior to the wafer thinning process, such that each wafer is customized according to the wafer profile. For example, the wafer processing system identifies wafer edge defects located at the perimeter regions of the wafer and modifies portions of the perimeter regions to create a barrier that prevents the defects from propagating into the device regions of the wafer during the wafer thinning process. In some embodiments, modifying portions of the perimeter region can include partially cutting through the wafer along the perimeter such that a trench is formed along the perimeter. In some embodiments, modifying portions of the perimeter region can include modifying physical properties of a portion of the wafer through non-invasive methods, such as stealth laser dicing.

Various embodiments described in the present disclosure can provide benefits such as, among other things, improved wafer processing yield, maintaining or improving vacuum hold during the wafer thinning process, improved wafer edge profile after wafer thinning process, among other things. The improved wafer processing yield in turn ensures and improves the performance and yield of semiconductor wafers.

Figure 1B:
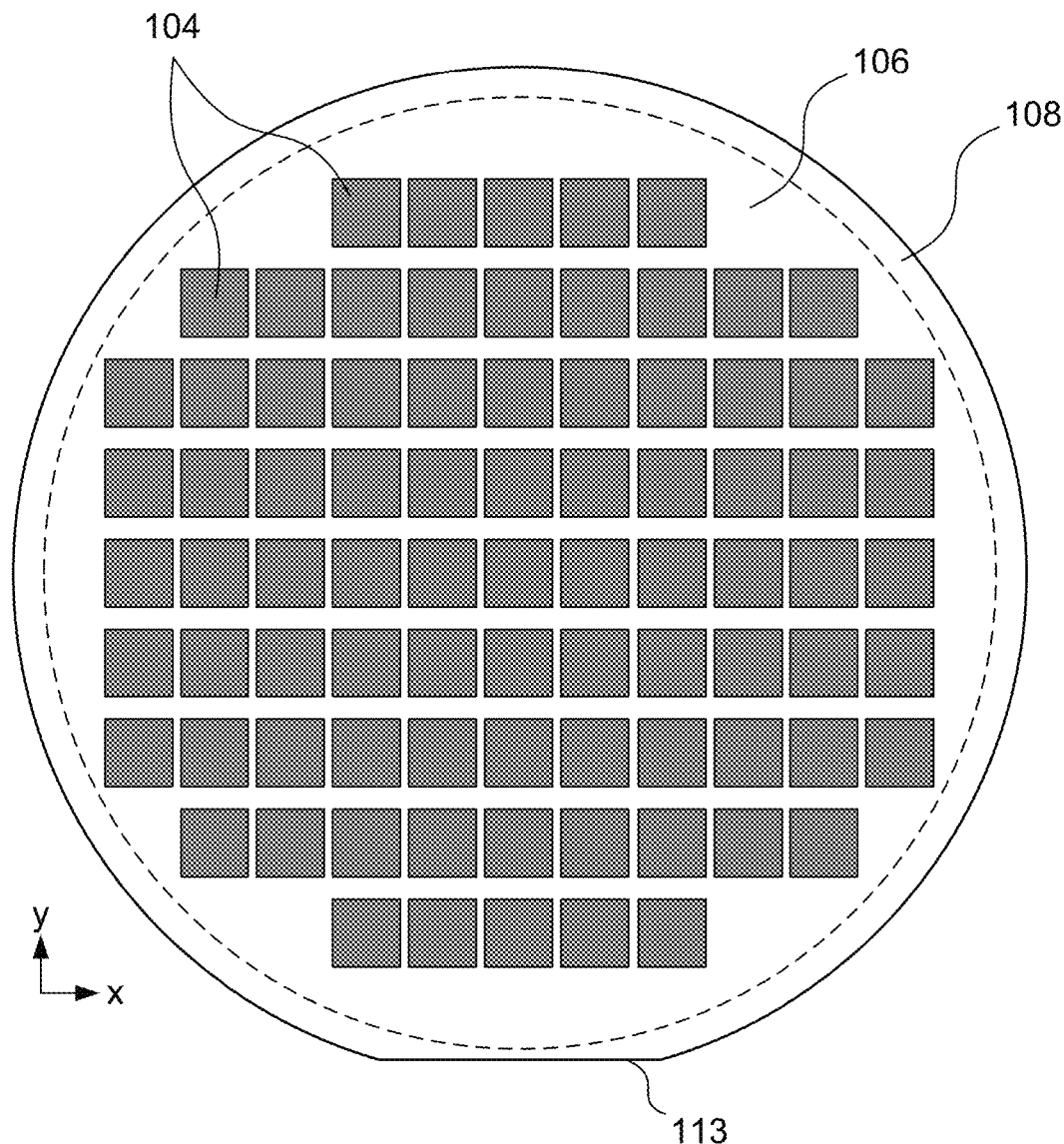

FIGS. 1A and 1B are respective cross-sectional and plan views of an exemplary semiconductor wafer, according to some embodiments. Semiconductor wafer 100 includes a substrate 102 and an array of semiconductor dies 104 formed on substrate 102. Semiconductor wafer 100 can include a top surface 102A and a bottom surface 102B. Semiconductor dies are areas on top surface 102A of semiconductor wafer 100 where integrated circuits are arranged in groups. One type of semiconductor wafer has a circular circumference that is truncated by a flat edge referred to as a wafer flat. As shown in FIGS. 1A and 1B, semiconductor wafer 100 includes a wafer flat 113 located in perimeter region 108. During fabrication, the positions of semiconductor dies are referenced to the wafer flat and the wafer center. Thus, wafer flat 113 is often a reference for semiconductor wafer 100 and used by equipment to precisely place semiconductor wafer 100 in a desired position. In some embodiments, semiconductor dies 104 extend into the body of substrate 102. In some embodiments, semiconductor dies 104 are formed on a top surface of substrate 102, as illustrated in FIG. 1A. Semiconductor wafer 100 includes device region 106 where dies 104 are positioned and a ring-shaped perimeter region 108 that surrounds device region 106. In some embodiments, perimeter region 108 does not include any semiconductor dies. In some embodiments, perimeter region 108 can include dummy dies to maintain processing uniformity and do not include active devices. Perimeter region 108 can include wafer edge 110 that physically connects the top and bottom surfaces of semiconductor wafer 100 and extends substantially in the vertical direction (e.g., z direction). In some embodiments, wafer edge 110 can be a smooth plane that is substantially perpendicular to the top or bottom surface of wafer 100. In some embodiments, at least portions of wafer edge 110 can be a curved surface. However, wafer edge 110 can also include various defects that may impair the structural integrity of the semiconductor wafer during fabrication operations such as a wafer thinning process.

Figure 2A:
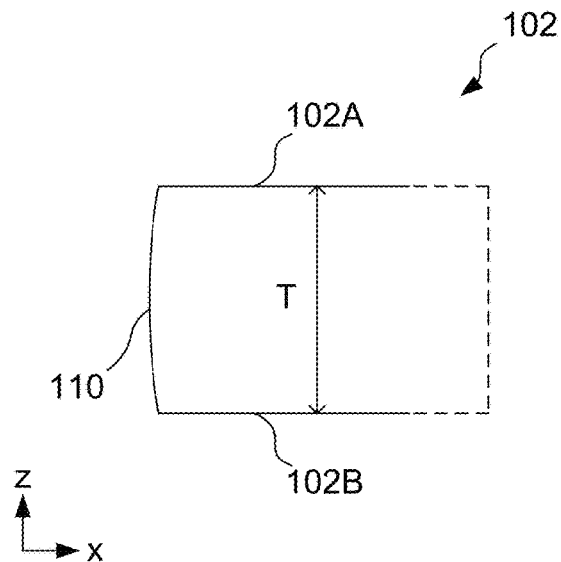
FIGS. 2A-2D are cross-sectional views of edge portions of semiconductor wafers, in accordance with some embodiments of the present disclosure.
Figure 2B:
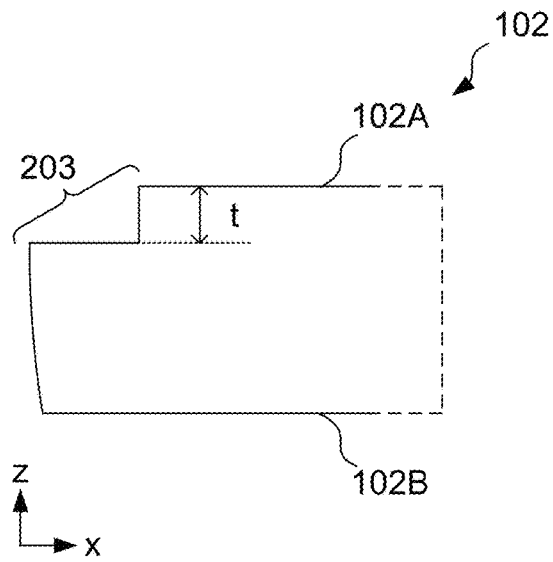
Figure 2C:
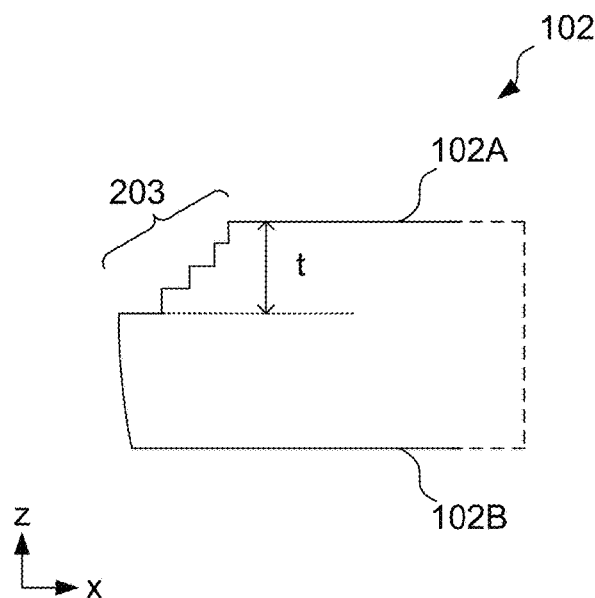
Figure 2D:
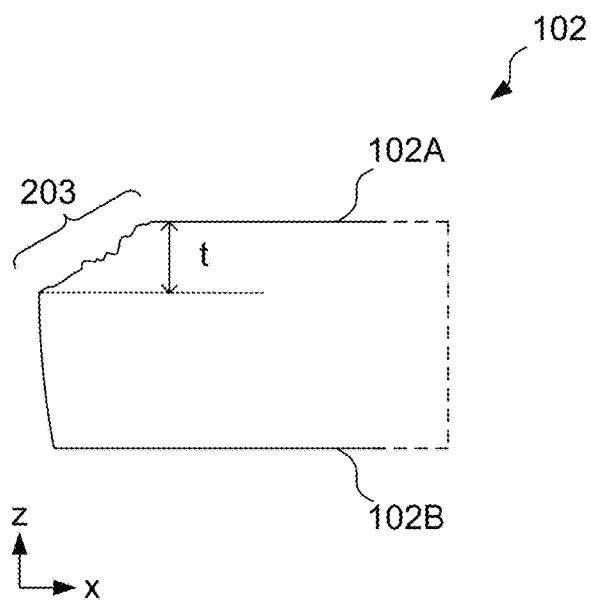

FIGS. 2A-2B are close-up views of wafer edge region 112 in FIG. 1 and respectively illustrates various wafer edge profiles of wafer edge 110, according to some embodiments. FIG. 2A illustrates a standard wafer edge without defects. As shown in FIG. 2A, wafer edge 110 is a substantially smooth surface that continuously connects top surface 102A and bottom surface 102B of wafer 100. In some embodiments, wafer edge 110 can have a curved contour along the vertical direction (e.g., z direction). In some embodiments, wafer edge 110 can have a substantially straight contour along the vertical direction (not illustrated in FIG. 2A). FIGS. 2B-2D illustrate exemplary edge defects 203 that can occur on or adjacent to wafer edge 110. Edge defects 203 illustrated in FIGS. 2B-2D can be caused by accidental removal (e.g., chipping) of a portion of wafer edge 110. In some embodiments, edge defects 203 can be a result of a wafer fabrication process. FIGS. 2B and 2C respectively illustrate edge defects 203 such as one-step staircase and multi-step staircase defects. FIG. 2D illustrates edge defect 203 having an irregularly shaped contour. Each edge defect 203 illustrated in FIGS. 2B-2D can have a defect depth t as measured from wafer top surface 102A in the vertical direction. Defect depth t can vary based on the type and severity of edge defect 203. In some embodiments, a ratio A of defect depth t over substrate thickness T can be between about 1% and about 80%. For example, ratio A of t/T can be between about 1% and about 20%, between about 20% and about 50%, between about 50% and about 80%, or any suitable ratio. In some embodiments, ratio A can be less than about 1% or greater than about 80%. In some embodiments, edge defect 203 can be extend to be adjacent to wafer back surface 102B and is not illustrated in FIGS. 2A-2D for simplicity.

Figure 3:
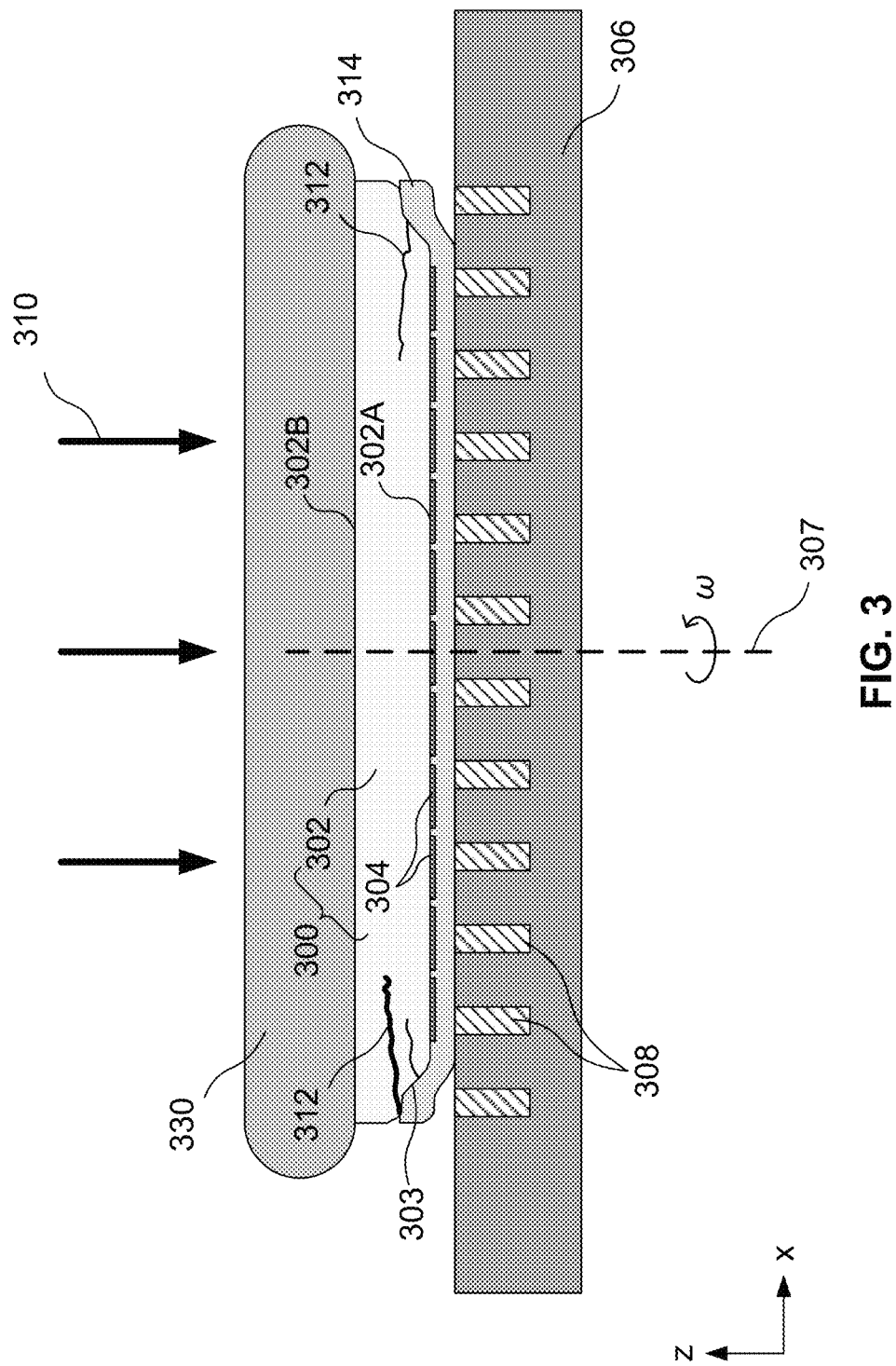
FIG. 3 is a cross-sectional view of a wafer in a wafer thinning apparatus, in accordance with some embodiments of the present disclosure.

FIG. 3 illustrates a semiconductor wafer mounted in a wafer-thinning apparatus during a wafer thinning process, according to some embodiments. In some embodiments, the wafer-thinning apparatus can be a rotational back grinder or a CMP tool. A rotational back grinder for example, can include a chuck 306 and vacuum channels 308 embedded therein. Chuck 306 can be configured to rotate around an axis 307 at a pre-set rotational speed ω. Wafer 300 can include substrate 302 and semiconductor dies 304 formed on wafer front surface 302A. Wafer 300 can also include edge defects 303 formed in proximity to the perimeter of substrate 302. In some embodiments, substrate 302, edge defects 303, and semiconductor dies 304 are respectively similar to substrate 102, edge defects 203, and semiconductor dies 104 described in FIGS. 1 and 2A-2D and are not described in detail herein for simplicity. Front surface 302A of wafer 300 can be attached to a protective tape 314 that is mounted on chuck 306 using negative pressure generated by vacuum channels 308. Vacuum channels 308 can be coupled to one or more vacuum sources (e.g., rough pumps) that are not illustrated for simplicity. In some embodiments, protective tape 314 can be a back-grinding (BG) tape used to protect wafer surfaces during a back-grinding process. Protective tape 314 can contour front surface 302A including the surface of edge defects 303. A grinding process 310 can be applied to back surface 302B of substrate 302 to reduce the thickness of substrate 302. During the grinding process, a back grinder cup wheel 330 is pressed against back surface 302B and is rotated at a nominal rotational speed. The relative lateral movement between back grinder cup wheel 330 and wafer 300 as well as the downward pressure from back grinder cup wheel 330 can uniformly remove material from substrate 302. However, the downward pressure from back grinder cup wheel 330 can cause edge defects 303 to exacerbate and may result in fractures 312 that extend into the bulk body of substrate 302. Fractures 312 can impair the structural integrity of substrate 302 which can in turn lead to wafer failure and low fabrication yield.

Figure 4A:
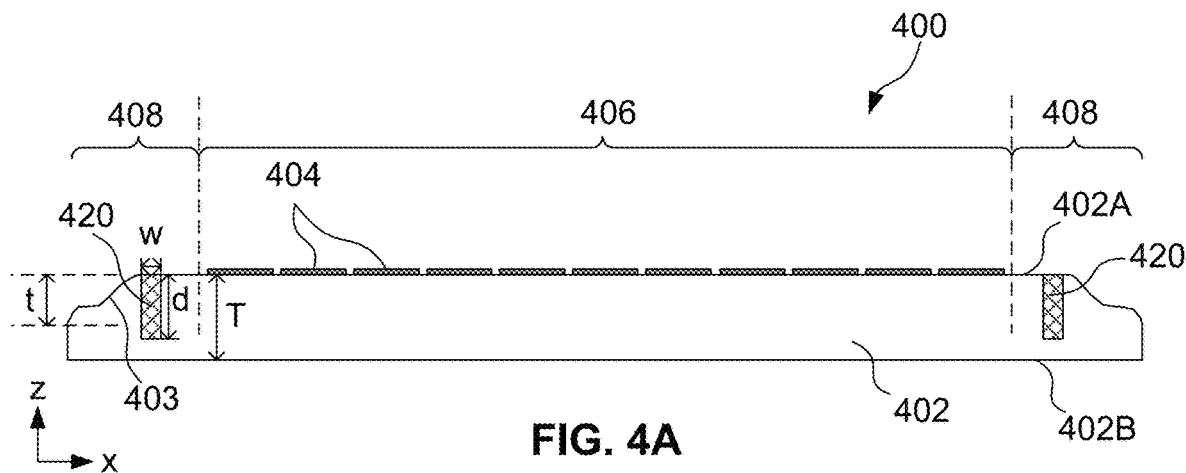
FIGS. 4A and 4B are views of a semiconductor wafer incorporating wafer modifications, 5 in accordance with some embodiments of the present disclosure.
Figure 4B:
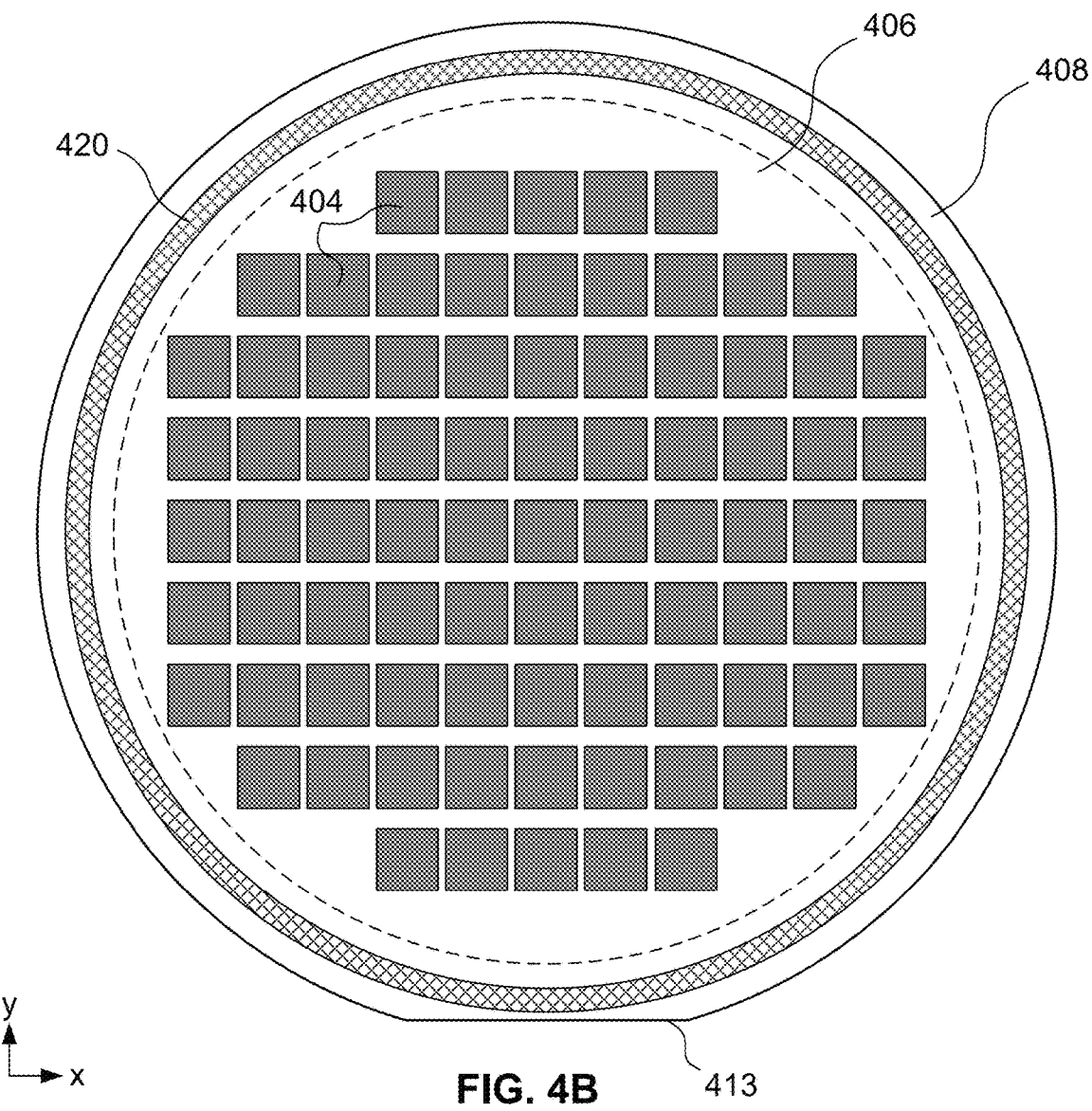

FIGS. 4A and 4B illustrate a partially modified semiconductor wafer prior to a wafer thinning process. FIGS. 4A and 4B are respectively cross-sectional view and plan view of semiconductor wafer that includes substrate 402, edge defects 403, and semiconductor dies 404. Other suitable structures can be included on semiconductor wafer 400 and are not illustrated for simplicity. Semiconductor wafer 400 can include device region 406 and a ring-shaped perimeter region 408 surrounding device region 406. Edge defects 403 are formed in a perimeter region of wafer 400 that is between the wafer edge and semiconductor dies 404. The aforementioned structures of semiconductor wafer 400 can respectively be similar to those described in FIGS. 1A-1B, 2A-2D, and 3, and are not described in detail herein for simplicity. Semiconductor wafer 400 can also include wafer modifications region 420 that are formed in perimeter regions 408. Wafer modification region 420 is positioned in the perimeter region 408 and between edge defects 403 and semiconductor dies 404. Wafer modification region 420 can enable mechanical separation between edge defects 403 and device region 406 such that edge defects 403 do not propagate into device region 406 during a wafer thinning process. In some embodiments, wafer modification region 420 can be a trench formed by invasive methods, such as removing a portion of material from substrate 402. For example, the trench can be formed by a mechanical dicing technique (e.g., via a dicing blade) and partially dicing the wafer (e.g., without penetrating through the entire thickness of the wafer) along the wafer circumference. In some embodiments, wafer modification region 420 can be formed by a patterning and etching process. In some embodiments, wafer modification region 420 can be formed by changing the material property via various non-invasive methods, such as stealth laser dicing that forms a modified layer within the wafer by focusing a laser beam inside the wafer. During a stealth laser dicing process, a focused infrared laser beam penetrates the backside of a semiconductor wafer and creates highly localized brief melting, transforming one type of material into another and surrounding it by a field of concentrated stress and micro cracks. For example, infrared laser beams can locally transform a crystalline silicon material into a polysilicon material. The infrared laser can be sequentially focused at different depths of the substrate, so that stacked vertical planes of modified material are formed. These subsurface modified layers essentially create weakened cleaving planes that enable mechanical separation in the vertical direction (e.g., z direction) that extend along the wafer circumference. During the wafer thinning process, a portion of semiconductor wafer 400 that includes edge defects 403 can break off from another portion of semiconductor wafer 400 that includes semiconductor dies 404 through the trench or by following the induced controlled fractures.

Wafer modification region 420 can be formed from front surface 402A of wafer 400 and have a modification depth d as measured from wafer front surface 402A. In some embodiments, modification depth d is equal to or greater than defect depth t such that when semiconductor wafer 400 is being thinned from wafer back surface 402B, the back grinder cup wheel of the wafer thinning apparatus is in contact with wafer modification region 420 before it forms contact with wafer defects 403. In some embodiments, a ratio B of modification depth d over substrate thickness T can be between about 1% and about 80%. For example, ratio B of d/T can be between about 1% and about 20%, between about 20% and about 50%, between about 50% and about 80%, or any suitable ratio. In some embodiments, ratio B can be less than about 1% or greater than about 80%. Lowering the ratio B can provide the benefit of greater mechanical strength of wafer 400, particularly in perimeter region 408. In some embodiments, ratio B of d/T can be greater than ratio A of t/T described above with reference to FIGS. 2A-2D. In some embodiments, modification depth d is equal to or greater than defect depth t. For example, a ratio C of t/d (i.e., defect depth t over modification depth d) can be between about 50% and about 100%. In some embodiments, ratio C can be between about 50% and about 70%, between about 70% and about 85%, between about 85% and about 100%. A lower value of ratio C can assure that modification depth d exceeds defect depth t; while a higher value of ratio C can provide the benefit of having a lower penetration depth of wafer modification region 420 that can in turn reduce fabrication cost. As discussed above, wafer flats are used by various fabrication equipment to locate the wafer and identify the orientation of the wafer, so maintaining the wafer flat is essential for wafer fabrication. Therefore, having wafer modification region 420 penetrating only a portion of substrate 402 can provide the benefit of keeping wafer flat 413 intact before the wafer thinning process. In contrast, a ring-shaped trench that penetrates the entire thickness of substrate 402 can lead to wafer flat 413 being removed and result in costly equipment modification in order to accommodate a flat-less wafer. Wafer modification region 420 can have a width w that is equal or less than a separation between edge defects 403 and active region 406. In some embodiments, width w can be between about 20% and about 80% of modification depth d. For example, a ratio of width w over modification depth d can be between about 20% and about 40%, between about 40% and about 60%, between about 60% and about 80%, or any suitable ratio.

Figure 5:
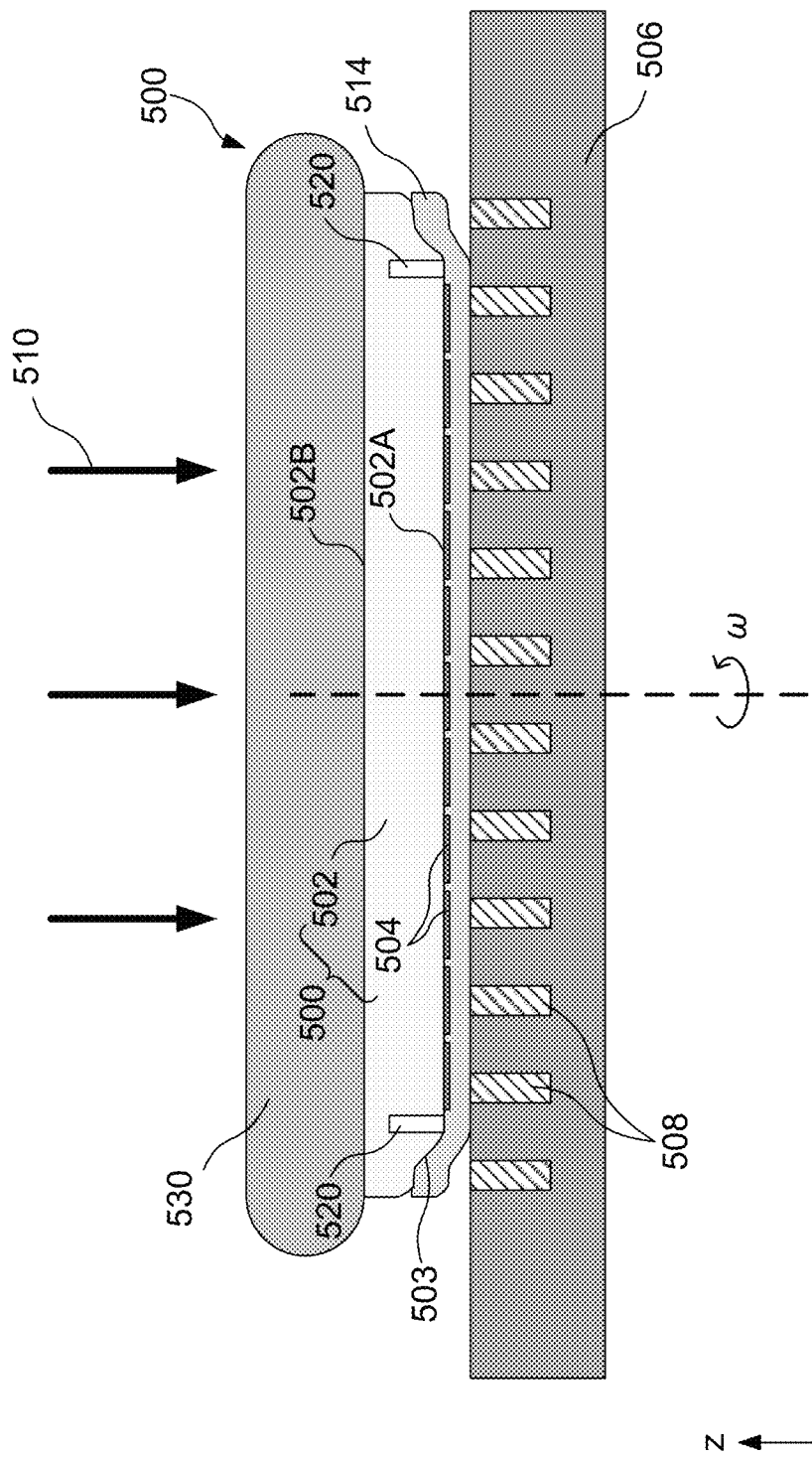
FIGS. 5 and 6 are cross-sectional views of a semiconductor wafer that incorporates wafer modifications during a wafer thinning process, in accordance with some embodiments of the present disclosure.

FIG. 5 is a cross-sectional view of a modified semiconductor wafer mounted in a wafer-thinning apparatus at the beginning of a wafer thinning process, according to some embodiments. Wafer 500 includes substrate 502, edge defects 503, semiconductor dies 504, and wafer modification region 520. The aforementioned structures of wafer 500 can be respectively similar to those of wafer 400 described in FIGS. 4A-4B. Wafer modification region 520 illustrated in FIG. 5 can be a trench formed by removing a ring-shaped portion of material from substrate 502. In some embodiments, the removed portion can be variations of a ring-shaped structure. For example, the removed portion can be partially ring-shaped (e.g., regions of the wafer are not removed) along the curvature of the ring-shaped removed portion) along the circumference of the ring shape. In some embodiments, the one or more breaks can be located in the proximity of the wafer flat. In some embodiments, the removed portion can be an oval-shaped structure. In some embodiments, wafer modification region 520 can also be any suitable modification that can provide a barrier that enables physical separation between edge defects 503 and semiconductor dies 504 during a wafer thinning process. Wafer 500 is flipped upside-down with its front surface 502A mounted on a protective tape 514. Wafer 500 is then positioned onto chuck 506 using negative pressure provided by vacuum channels 508. A grinding process 510 can be applied to back surface 502B to reduce the thickness of wafer 500. During the grinding process 510, a back grinder cup wheel 530 is pressed against substrate 502 and is rotated at a nominal rotational speed. Similar to the grinding process described in FIG. 3, the relative lateral movement between back grinder cup wheel 530 and wafer 500 as well as the downward pressure from back grinder cup wheel 530 can remove material from substrate 502.

Figure 6:
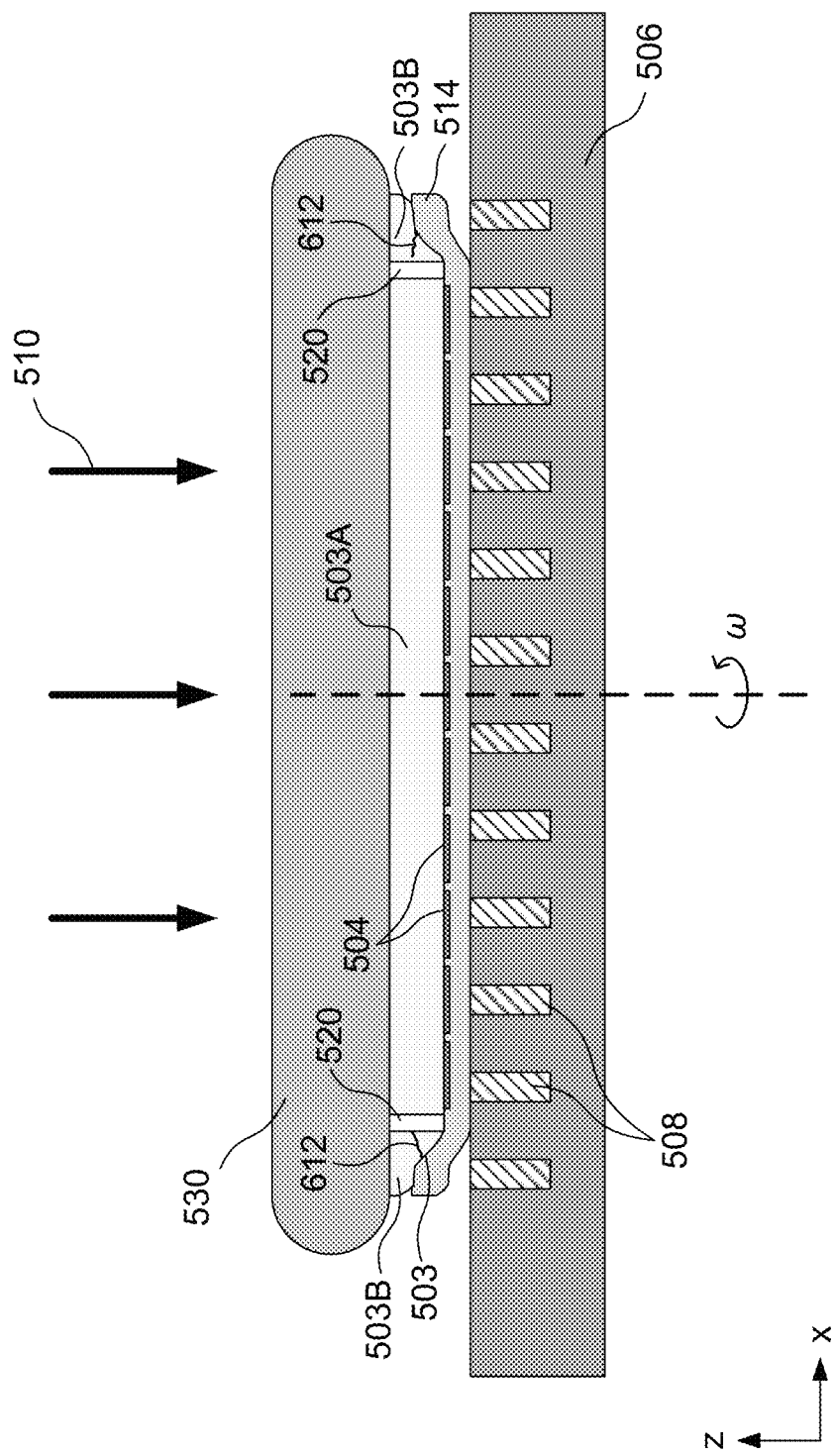

FIG. 6 is a cross-sectional view of a modified semiconductor wafer mounted in a wafer-thinning apparatus during a wafer thinning process, according to some embodiments. As grinding process 510 of FIG. 5 proceeds and back grinder cup wheel 530 moves further down (e.g., in the z direction), the thickness of substrate 502 is reduced and wafer modification region 520 is exposed. Wafer modification region 520 is configured to enable a physical separation between edge defects 503 and semiconductor dies 504 when wafer modification region 520 is exposed during grinding process 510. For example, as wafer modification region 520 is exposed, wafer portion 503A that includes semiconductor dies 504 is physically separated from wafer portion 503B that includes edge defects 503. Therefore, even though edge defects 503 can cause fractures 612 during grinding process 510, fractures 612 cannot propagate into the bulk of substrate 502 where semiconductor dies 504 are formed.

The wafer modification provides a number of benefits. First, limiting defect propagation improves wafer fabrication yield. Structural integrity of wafer active regions can be preserved because defects generated by edge defects during grinding cannot propagate into the bulk substrate. Second, the amount of debris can be reduced during the wafer grinding process. Because wafer portion 503B is detachably attached to wafer portion 503A prior to the grinding process and is separated from wafer portion 503A in a controlled manner via wafer modification region 520, only a minimal amount of debris is generated compared to the debris or wafer chipping that may be generated during grinding process 310 in FIG. 3 where semiconductor wafer 300 is being thinned down. Third, vacuum quality can be improved around the circumference of wafer 500 during the grinding process. For example, prior to grinding process 510, protective tape 514 adhered to wafer portion 503B need not be in contact with vacuum channel 508 due to the irregular shape of edge defects 503, and may come into contact with vacuum channel 508 after wafer portion 503B is separated from wafer portion 503A.

Figure 7:
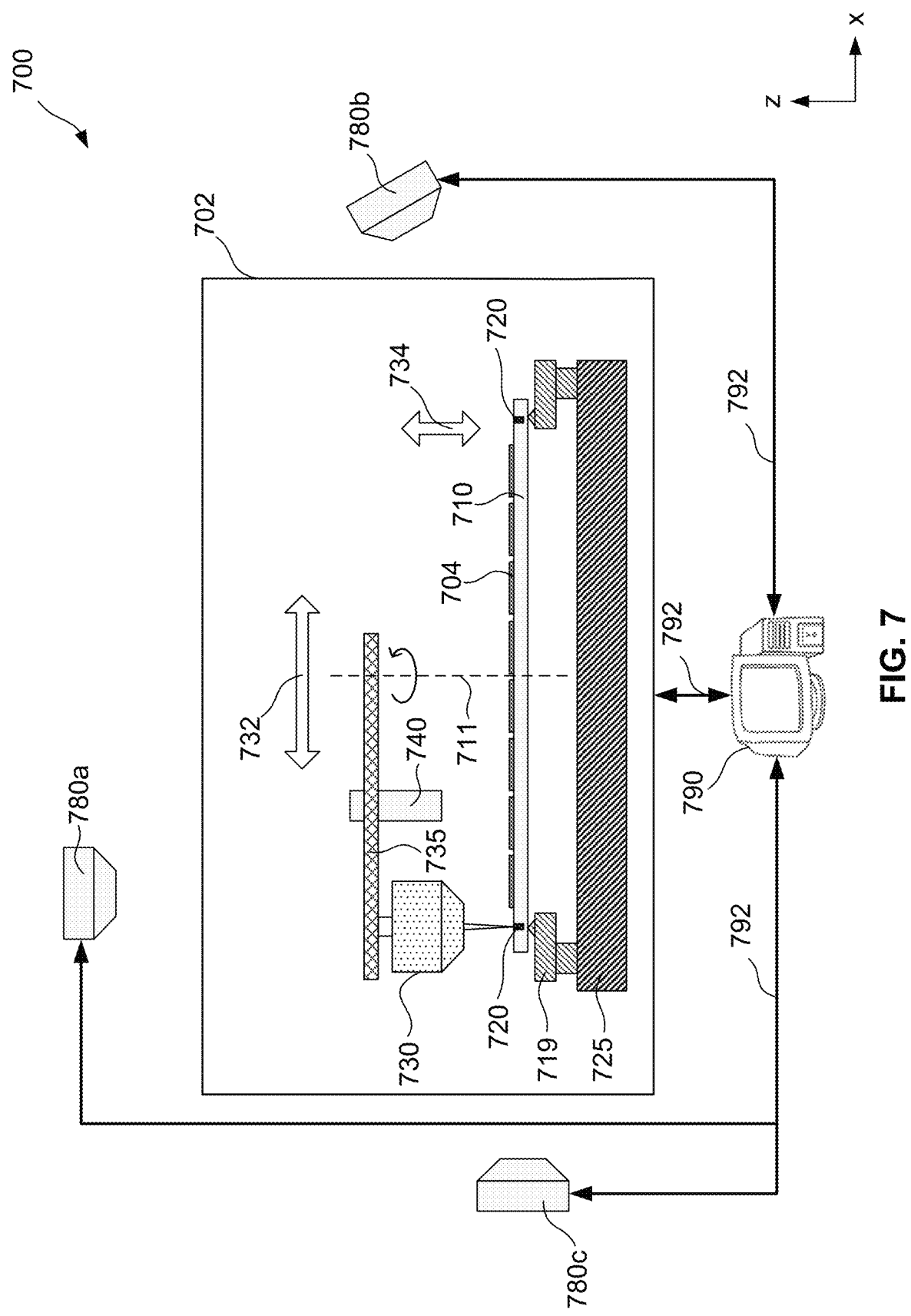
FIGS. 7 and 8 illustrate an exemplary apparatus for forming wafer modifications in semiconductor wafer, in accordance with some embodiments of the present disclosure.
Figure 8:
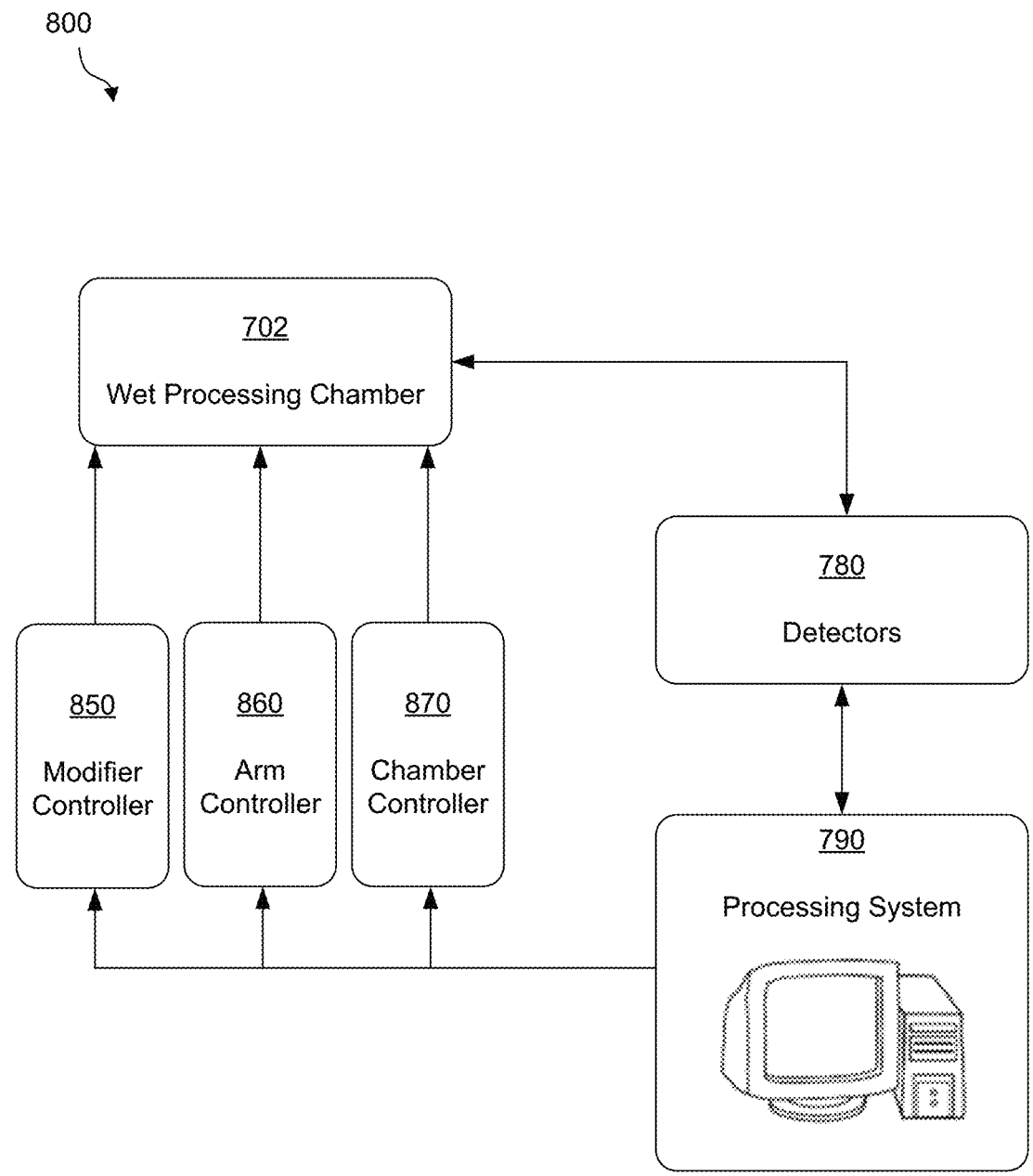
Figure 9:
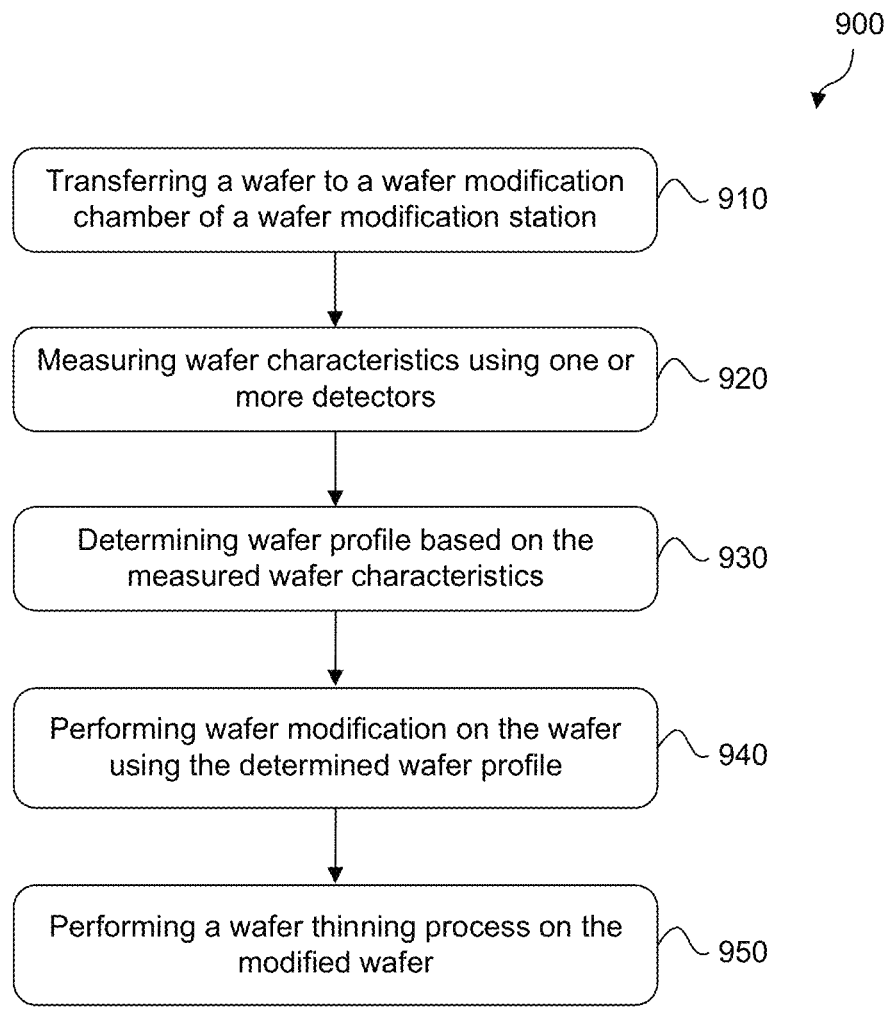
FIG. 9 illustrates an exemplary fabrication process for forming wafer modifications in semiconductor wafers, in accordance with some embodiments of the present disclosure.

FIGS. 7 and 8 illustrate an exemplary wafer modification system, according to some embodiments. FIG. 9 is a flow chart of method 900, which describes an exemplary method for processing a semiconductor wafer, according to some embodiments. By way of example and not limitation, the wafer modification process of method 900 can be performed in wafer modification station 700 and wafer modification system 800 shown in FIGS. 7 and 8 respectively. This disclosure is not limited to this operational description. Rather, other operations are within the spirit and scope of the present disclosure. It is to be appreciated that additional operations may be performed. Moreover, not all operations may be needed to perform the disclosure provided herein. Further, some of the operations may be performed simultaneously, or in a different order than shown in FIG. 9. In some implementations, one or more other operations may be performed in addition to or in place of the presently described operations. For illustrative purposes, method 900 is described with reference to the embodiments of FIGS. 1-8. However, method 900 is not limited to these embodiments. For example purposes, method 900 will be described for a single-wafer wafer modification station. Based on the disclosure herein, method 900 can be equally applied to batch wafer modification stations that can process multiple wafers at a time. Both single-wafer and batch station configurations are within the spirit and scope of this disclosure.

Method 900 begins with operation 910, where a wafer is transferred to a wafer modification chamber of a wafer modification station 700, according to some embodiments. For example, wafer 710 can be transferred to wafer modification chamber 702 via a transfer module with a robotic arm (not shown). Wafer modification chamber 702 can be a module in a wafer processing cluster tool, which can further include additional wafer processing stations, modules, and equipment appropriate for its operation.

Wafer modification station 700 can be a component of a processing cluster tool (not shown in FIG. 7 for simplicity). The processing cluster tool can include additional components, such as modules (e.g., transfer modules and dicing stations), robotic arms, pumps, exhaust lines, heating elements, gas and chemical delivery lines, controllers, valves, and external and internal electrical connections to other components of the cluster tool (e.g., computer units, chemical analyzers, motor controllers, mass flow controllers, pressure controllers, valves, and pumps). Such additional components, while not be depicted in FIG. 7, can be combined with those illustrated components without departing from the spirit and scope of this disclosure.

Wafer modification station 700 can include processing chamber 702, wafer holder 719, spin base 725, modifier 730, arm 735, and motor 740. Modifier 730 can be any suitable wafer-modifying apparatus that can modify physical or chemical properties of selective regions of a semiconductor wafer. Wafer modification station 700 can further include detectors 780a-780c positioned around processing chamber 702 to detect wafer characteristics, such as properties of wafer edge defects. A processing system 790 can receive the detected wafer characteristics via communication channels 792 and generate wafer profiles. In some embodiments, wafer profiles can include metrological data of the wafer. For example, the wafer profiles can include the dimension, material composition, defect type and location, as well as any other suitable information customized for each individual wafer. In some embodiments, the wafer profiles can be selected from a database of wafer profiles based on the characteristics of the individual wafers.

Referring to FIG. 9, method 900 begins with operation 910 that includes transferring a wafer to a wafer modification chamber of a wafer modification station, according to some embodiments. As shown in FIG. 7, a wafer 710 is positioned in processing chamber 702. Wafer 710 can be secured onto a wafer holder 719 using a clamp, a vacuum chuck, adhesive tape, or the like. In some embodiments, wafer 710 can include semiconductor dies 704 formed on a front surface of wafer 710. Wafer holder 719 is further attached to a spin base 725 of wafer modification station 700. In some embodiments, wafer holder 719 can spin semiconductor wafer 710 via spin base 725 during a wafer modification process at different rotational speeds. In some embodiments, semiconductor wafer 710 can be rotated at any suitable rotational speed. For example, semiconductor wafer 710 can be rotated at about 300 rpm, 500 rpm, 1000 rpm, 2000 rpm, or any suitable rotational speed.

Method 900 continues with operation 920 that includes measuring wafer characteristics using one or more detectors, according to some embodiments. Referring to FIG. 7, one or more detectors 780a-780c can be positioned around wafer modification chamber 702 to detect and measure wafer characteristics, such as properties of wafer edge defects. For example, detectors 780a-780c can be configured to detect whether wafer edge defects exist at the circumference of semiconductor wafer 710. In response to wafer edge defects being detected, detectors 780a-780c proceed to measure various characteristics of the wafer edge defects, such as the location, defect depth, width, and type of wafer edge defects. Examples of wafer edge defects can be wafer edge defects 203, 303, 403, and 503 respectively described in FIGS. 2A-2D and 3-5. In some embodiments, detectors 780a-780c are positioned around sidewalls and/or top/bottom walls of wafer modification chamber 702. Data representing the characteristics of the detected wafer edge defects can be transmitted to processing system 790 which can determine whether the wafer edge defects are below a variation threshold, such as whether the detected wafer edge defects are excessive (e.g., extending into semiconductor dies 704). In response to the wafer edge defects not being excessive, processing system 790 proceeds to create wafer modification profiles for forming wafer modification regions in semiconductor wafer 710. In response to the wafer edge defects being excessive, processing system 790 can proceed to alert a user or select dies to be sacrificed. Detectors 780a-780c can also determine For example, three detectors can be positioned around wafer modification chamber 702, with a detector facing a sidewall and a top wall of wafer modification chamber 702. In some embodiments, viewports can be installed on sidewalls and the top wall of wafer modification chamber 702 and aligned with respective detectors such that the interior of wafer modification chamber 702 is visible to the respective detectors. In some embodiments, detectors 780a-780c can be within wafer modification chamber 702. In some embodiments, detectors 780a-780c can be configured to detect wafer characteristics of semiconductor wafer 710, such as, for example, thickness, width, and types of wafer edge defects on semiconductor wafer 710. In some embodiments, detectors 780a-780c can be installed in a detector chamber that is configured to detect wafer characteristics before semiconductor wafer 710 is transported into wafer modification chamber 702. In some embodiments, detectors 780a-780c can be a laser thickness sensor, optical profiler, step profiler, multi-wavelength ellipsometer, ion beam analyzer, and/or any other suitable detectors or combinations thereof. In some embodiments, detectors 780a-780c can each be a charge-coupled device (CCD) camera that is a component of a CCD-based image detection system. In some embodiments, photocells, or other such automated detecting apparatus that detect an image of an area presented thereto can also be used. In some embodiments, detectors 780a-780c can include at least one CCD monochrome or color camera, depending on the process being inspected. Therefore, detectors 780a-780c can each be configured to produce one or more high-resolution images of the wafer and provide the high-resolution images to a user or a processing system.

Referring to FIG. 9, method 900 continues with operation 930 that includes determining wafer profile based on the measured wafer characteristics, according to some embodiments. As shown in FIGS. 7 and 8, a processing system 790 can be electrically connected to detectors 780a-780c and wafer modification chamber 702 through communication channels 792. Processing system 790 can include processing circuitry and software for analyzing signals produced by detectors 780a-780c and generate wafer profiles using the signals. Communication channels 792 can be any suitable wiring, fiber optics or wireless technology for transmitting signals. The generated wafer profiles can be suitable for viewing by a user. For example, the resulting wafer profiles can be displayed on processing system 790 or a viewing device such as a computer monitor located at, for example, an operator work station. The generated wafer profiles can include information such as the location, depth, width, and type of wafer edge defects that are in the perimeter region of the semiconductor wafers.

Based on the wafer profile, processing system 790 can determine a wafer modification recipe or processing condition suitable for the wafer. For example, the wafer modification recipe can depend on the defect depth of the wafer edge defects. Specifically, processing system 790 can set the depth of the wafer modification to be equal to or greater than the edge defect depth. Examples of defect depth and modification depth can be defect depth t and modification depth d described in FIGS. 2A-2D and 3-5. The wafer modification recipe can also include information related to the position of wafer modification. For example, the wafer modification can be positioned along the wafer's circumference and within the perimeter region. The detectors can be operated by processing system 790 to take a one-time measurement of the wafer characteristics, or can be operated to continuously measure wafer characteristics at predetermined intervals during wafer processing. Therefore, the detectors can provide continuous monitoring of wafer processing and transmit the detected results to processing system 790 such that processing system 790 can adjust the processing recipe or conditions in real-time during the wafer modification process.

In some embodiments, the processing system 790 can be configured to receive extremely large data sets (e.g., big data) and computationally analyze them to reveal patterns, trends, and associations, relating to wafer edge defects and the resulting processed wafer. Specifically, processing system 790 can receive from detectors collected data sets representing wafer edge shape, thickness, compositions, roughness, and any other suitable characteristics of the wafer, and analyze the data sets with reference to the wafer modification process. The data sets can be used as a feedback for processing system 790 to fine tune the wafer modification recipe in real-time or after processing such that the wafer modification process can be continuously improved, which in turn results in improved wafer processing uniformity and device yield.

Processing system 790 can be configured to perform a variety of additional or alternative analytical tasks, such as analysis of any suitable signals, statistics processing, task scheduling, generation of alarm signals, generation of further control signals, and the like. For example, upon detection of excessive wafer edge defects, processing system 790 can be configured to generate alarm signals to alert a user. Processing system 790 can be further configured to perform a series of scheduled tasks within the wafer modification chamber to reduce wafer edge defects. In some embodiments, examples of excessive wafer edge defects can include wafer edge defects that expand into the wafer active device region. In response to the detection of excessive wafer edge defects, processing system 790 can determine appropriate next steps, such as identifying semiconductor dies that may be impacted by the wafer edge defects and adjust the path of wafer modification accordingly. Other various wafer modification parameters can include, for example, travelling speed, position, angle of modifier 730, rotating speed of semiconductor wafer 710, combinations thereof, and any other suitable processing parameters. Processing system 790 can be placed adjacent wafer modification chamber 702 so that, for example, an operator can easily access both processing system 790 and wafer modification chamber 702 to determine the wafer edge defect and wafer modification process and to correct any issues that may arise. Alternatively, in some embodiments, processing system 790 can be placed at a remote location, such as a process command center where a variety of images from a variety of processing stations or wet benches can be monitored together.

Referring to FIG. 9, method 900 continues with operation 940 that includes performing a wafer modification process on a semiconductor wafer based on the measured wafer characteristics, according to some embodiments. As shown in FIG. 7, wafer modifications 720 can be formed on wafer 710 according to one or more wafer modification recipes.

Wafer modification station 700 includes modifier 730 attached to arm 735. Processing system 790 can direct modifier 730 to perform wafer modification processes based on wafer modification profiles. In some embodiments, modifier 730 can be a dicing blade configured to perform a partial dicing process, such as removing a portion of material from wafer 710 without penetrating through the entire thickness of the wafer. For example, the dicing blade can penetrate into wafer 710 at a pre-set depth (e.g., modification depth d described in FIGS. 4A and 4B) that is less than the wafer thickness and form a ring-shaped trench that is substantially concentric with the ring-shaped perimeter regions of wafer 710. In some embodiments, the trench extends into wafer 710 without fully penetrating the wafer's entire thickness. In some embodiments, modifier 730 can be a set of laser focusing lens that focuses infrared laser beams at a focal point that is inside the bulk substrate of wafer 710. Various parameters of modifier 730 can be adjusted such that a partial stealth laser dicing process is performed, such as penetrating a portion but not the entire thickness of wafer 710. For example, power, frequency, focus depth, number of passes, shifting distances, and any suitable parameters can be adjusted based on the physical and chemical properties of the material that forms wafer 710. Increasing the laser frequency can provide the benefit of having smoother cleaving planes. In addition, increasing the laser power can provide the benefit of forming more micro cracks. In some embodiments, modifier 730 can provide infrared laser having power of about 85 W and frequency of about 60 kHz to form a modification layer in semiconductor wafer 710 when its substrate is formed using single crystalline silicon. Modifier 730 can move laterally along the x-direction (e.g., along direction 732) by motor 740 through arm 735 such that modifier 730 can be directly above any suitable region on semiconductor wafer 710. For example, modifier 730 can be positioned above a perimeter region of wafer 710. An example of a wafer perimeter region can be perimeter region 408 described in FIGS. 4A and 4B. In some embodiments, modifier 730 can pass more than once in the desired region. Modifier 730 can also move vertically in the y-direction (e.g., along direction 734) such that a height between semiconductor wafer 710 and modifier 730 can be adjusted prior, during, or after the wafer modification process. For example, the laser focal point or blade cut depth of modifier 730 can be adjusted by moving modifier 730 in the vertical direction. In some embodiments, modifier 730 can also rotate around a vertical axis 711 of wafer 710 such that modifier 730 can form ring-shaped modified portions that are substantially concentric with wafer 710. For example, modifier 730 can be configured to rotate 90°, 180°, 360°, or any suitable ranges. In some embodiments, modifier 730 can contour the circumference of wafer 710. In some embodiments, other suitable parameters of modifier 730 can be adjusted for the duration of the process based on the detected wafer profile and processing conditions. In some embodiments, adjustable parameters include, but are not limited to: the height between modifier 730 and semiconductor wafer 710; the orientation of modifier 730 with respect to a top surface of semiconductor wafer 710; the travelling speed of modifier 730; the travelling path of modifier 730; any suitable parameters, and/or combinations thereof.

FIG. 8 is an illustration of wafer modification system 800, according to some embodiments. Wafer modification system 800 can include processing system 790, modifier controller 850, arm controller 860, and chamber controller 870, among other components. Wafer modification system 800 can further include other suitable components, such as additional detectors, sensors, pumps, valves, these structures are not illustrated in FIG. 8 for simplicity. In some embodiments, modifier controller 850, arm controller 860, and chamber controller 870 can include any suitable computer controlled modules such as valves, motors, or wafer stages. In some embodiments, the abovementioned controllers can control a variety of processing parameters based on the generated wafer profile and monitoring of the wafer modification process. In some embodiments, modifier 730 can be controlled by modifier controller 850 to provide infrared laser for stealth dicing. In some embodiments, modifier 730 can be controlled by modifier controller 850 to form a trench in wafer 710 using a rotating dicing blade. In some embodiments, modifier controller 850 can control the orientation of modifier 730 with respect to a top surface of semiconductor wafer 710, the dicing blade rotational speed, the laser power and frequency, and any suitable parameters. In some embodiments, arm controller 860 can be operated to move modifier 730 to be positioned above different regions of wafer 710. In some embodiments, arm controller 860 can also control the height between modifier 730 and semiconductor wafer 710, the lateral travelling speed of modifier 730, the travelling path of modifier 730, among other parameters. Chamber controller 870 can be used to control various parameters of wafer modification chamber 702, such as chamber pressure, temperature, and/or any suitable parameters. Detectors 780 and processing system 790 can determine wafer profiles for wafers transported into wafer modification chamber 702. Detectors 780 can be detectors 780*a*-780*c* in FIG. 7 that measure various characteristics of the wafer. For example, detectors 780 can determine the properties of the wafer edges and detect the existence of wafer edge defects. If wafer edge defect is detected, detectors 780 can further detect the position, depth, width, types, or any suitable properties of wafer edge defects and transmit the data to processing system 790 for further processing, such as creating wafer modification profiles. Processing system 790 receives the measured characteristics of the wafer and determine a wafer profile that can be used to modify the wafers accordingly. Specifically, processing system 790 can produce recipes of forming wafer modification regions based on the wafer profile. For example, processing system 790 can be configured to produce cross-sectional views and measurements of wafer edge defects illustrated in FIGS. 2B-2D. As a result, processing system 790 can control modifier 730 through arm controller 850 to form wafer modification regions 720 in wafer 710.

Referring to FIG. 9, method 900 continues with operation 950 that includes performing a wafer thinning process on a modified semiconductor wafer based on the measured wafer characteristics, according to some embodiments. An example of performing a wafer thinning process can be grinding process 510 performed on wafer 500 illustrated in FIGS. 5 and 6 and are not described in detail herein for simplicity.

Various embodiments described herein are directed to systems and methods for improving wafer processing yield during a wafer thinning process. More particularly, this disclosure is directed to a wafer processing system that is configured to determine wafer profiles and modify the wafer accordingly prior to the wafer thinning process, such that each wafer is customized according to the wafer profile. For example, the wafer processing system identifies defects located at the perimeter regions of the wafer and modify portions of the perimeter regions to create a barrier that prevents the defects from propagating into the device regions of the wafer during the wafer thinning process. In some embodiments, modifying portions of the perimeter region can include partially cutting through the wafer along the perimeter such that a trench is formed along the perimeter. In some embodiments, modifying portions of the perimeter region can include modifying physical properties of a portion of the wafer through non-invasive methods, such as stealth laser dicing.

In some embodiments, a method for processing a wafer includes measuring one or more wafer characteristics of the wafer using a plurality of detectors. The wafer includes a device region and a perimeter region. The method also includes determining a wafer modification profile of the wafer based on the measured one or more wafer characteristics. The method further includes modifying a ring-shaped portion of the wafer within the perimeter region using the wafer modification profile. The modified ring-shaped portion has a penetration depth that is less than a thickness of the wafer. The method further includes performing a wafer thinning process on the wafer.

In some embodiments, a method for processing a wafer includes detecting wafer edge defects at a circumference of the wafer. The wafer have front and back surfaces and an array of semiconductor dies on the front surface. The method also includes measuring one or more characteristics of the wafer edge defects, and the one or more characteristics comprise at least a defect depth. The method also includes modifying, from the front surface, a portion of the wafer that is between the array of semiconductor dies and the wafer edge defects. The modified portion has a penetration depth measured from the front surface and less than the defect depth. The method further includes performing a wafer thinning process on the back surface of the wafer.

In some embodiments, a wafer processing system includes one or more detectors configured to determine one or more characteristics of a wafer. The wafer has a device region and a perimeter region surrounding the device region. The wafer processing system further includes a wafer-modifying apparatus and a processing system. The processing system is configured to receive the one or more characteristics and determine a wafer modification profile based on the one or more wafer characteristics. The processing system is further configures to modify a ring-shaped portion of the wafer within the perimeter region using the wafer modification profile. The modified ring-shaped portion has a penetration depth that is less than a thickness of the wafer.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for processing a wafer, comprising:
   determining a wafer modification profile of a wafer based on one or more wafer characteristics;
   modifying a portion of the wafer from a first surface of the wafer using the wafer modification profile, wherein the modified portion has a penetration depth that is less than a thickness of the wafer; and
   performing a wafer thinning process on a second surface of the wafer, the second surface being on an opposite side of the first surface of the wafer.

2. The method of claim 1, wherein the modifying of the portion of the wafer comprises performing a stealth laser dicing process on the wafer.

3. The method of claim 1, wherein the modifying of the portion of the wafer comprises forming a wafer modification region between a device region and edge defects that are formed at a circumference of the wafer.

4. The method of claim 1, wherein the modifying of the portion of the wafer comprises forming a ring-shaped trench that is substantially concentric with the wafer.

5. The method of claim 4, wherein the forming of the ring-shaped trench comprises performing a dicing process that partially penetrates the thickness of the wafer.

6. The method of claim 1, wherein the performing of the wafer thinning process comprises performing a back grinding process on the second surface of the wafer.

7. The method of claim 6, wherein the performing of the back grinding process comprises:
   pressing a back grinder cup wheel against the second surface of the wafer;
   rotating the back grinder cup wheel to remove material from the wafer such that the back grinder cup wheel is in contact with the modified portion prior to being in contact with a wafer edge defect; and
   mechanically separating, at the modified portion, a device region from a perimeter portion of the wafer that includes the wafer edge defect.

8. The method of claim 1, wherein the further comprising measuring the one or more wafer characteristics, wherein measuring the one or more wafer characteristics comprises determining one or more properties of an edge defect in a perimeter region of the wafer and away from the modified portion.

9. The method of claim 8, wherein the determining of the one or more properties of the edge defect comprises measuring a defect depth of the edge defect.

10. The method of claim 9, wherein the determining of the wafer modification profile comprises setting the penetration depth to be equal to or greater than the defect depth.

11. A method for processing a wafer, comprising:
    detecting wafer edge defects at a circumference of the wafer, the wafer comprising front and back surfaces and an array of semiconductor dies on the front surface;
    measuring one or more characteristics of the wafer edge defects, wherein the one or more characteristics comprise at least a defect depth;
    modifying, from the front surface, a portion of the wafer that is between the array of semiconductor dies and the wafer edge defects, wherein the modified portion comprises a penetration depth measured from the front surface and less than the defect depth; and
    performing a wafer thinning process on the back surface of the wafer.

12. The method of claim 11, wherein the modifying of the portion of the wafer comprises forming a ring-shaped trench substantially concentric with the wafer and partially penetrating the wafer.

13. The method of claim 11, wherein the modifying comprises forming a ring-shaped modified layer using stealth laser dicing, wherein the ring-shaped modified layer is substantially concentric with the wafer.

14. The method of claim 11, wherein the performing of the wafer thinning process comprises performing a back grinding process on the back surface of the wafer.

15. The method of claim 14, wherein the performing of the back grinding process comprises:
    pressing a back grinder cup wheel against the back surface of the wafer;
    rotating the back grinder cup wheel to remove material from the wafer such that the back grinder cup wheel comes in contact with the modified portion prior to being in contact with the wafer edge defects; and
    mechanically separating, at the modified portion, the array of semiconductor dies from a perimeter portion of the wafer that includes the wafer edge defects.

* * * * *

UNITED STATES PATENT AND TRADEMARK OFFICE
CERTIFICATE OF CORRECTION

PATENT NO. : 12,131,924 B2
APPLICATION NO. : 17/119665
DATED : October 29, 2024
INVENTOR(S) : Liquan Cai et al.

Page 1 of 1

It is certified that error appears in the above-identified patent and that said Letters Patent is hereby corrected as shown below:

In the Claims

Claim 8, Column 16, Line 12: "The method of claim 1, wherein the further comprising" should read --The method of claim 1, further comprising--.

Signed and Sealed this
Eighth Day of April, 2025

Coke Morgan Stewart
*Acting Director of the United States Patent and Trademark Office*